(12) United States Patent
Nakayama

(10) Patent No.: US 7,592,681 B2
(45) Date of Patent: Sep. 22, 2009

(54) SOLID-STATE IMAGING APPARATUS

(75) Inventor: Takashi Nakayama, Ina (JP)

(73) Assignee: Olympus Corporation, Tokyo (JP)

( * ) Notice: Subject to any disclaimer, the term of this patent is extended or adjusted under 35 U.S.C. 154(b) by 5 days.

(21) Appl. No.: 11/878,833

(22) Filed: Jul. 27, 2007

(65) Prior Publication Data
US 2008/0023784 A1 Jan. 31, 2008

(30) Foreign Application Priority Data
Jul. 27, 2006 (JP) ............................. 2006-204284

(51) Int. Cl.
*H01L 31/0224* (2006.01)
(52) U.S. Cl. .................. 257/459; 257/433; 257/693; 257/784; 257/E31.124
(58) Field of Classification Search ............... 257/433, 257/459, 693, 784, E31.124
See application file for complete search history.

(56) References Cited

U.S. PATENT DOCUMENTS 7,382,432 B2 * 6/2008 Yanagawa et al. ........... 349/153

2002/0197025 A1 * 12/2002 Vaganov et al. .............. 385/92
2003/0094495 A1 * 5/2003 Knowles et al. ......... 235/462.14
2008/0225223 A1 * 9/2008 Yanagawa et al. ........... 349/155

FOREIGN PATENT DOCUMENTS

JP 2003-133654 A 5/2003

* cited by examiner

*Primary Examiner*—Victor A Mandala
(74) *Attorney, Agent, or Firm*—Westerman, Hattori, Daniels & Adrian, LLP.

(57) ABSTRACT

A solid-state imaging apparatus including: a solid-state imaging device chip having an electrode pad provided on its front face; and a flexible board having a connecting electrode formed on an end face and being adhered at an end portion thereof to a side face of the solid-state imaging device chip so that the connecting electrode is positioned substantially in the same place as the electrode pad of the solid-state imaging device chip. The electrode pad of the solid-state imaging device chip and the connecting electrode of the flexible board are electrically connected to each other.

7 Claims, 3 Drawing Sheets

FIG. 1A PRIOR ART    FIG. 1B PRIOR ART
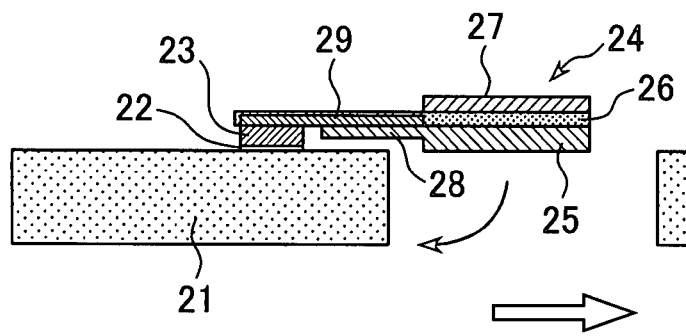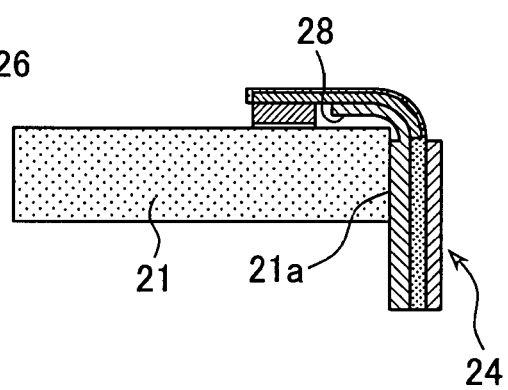
FIG. 2 PRIOR ART
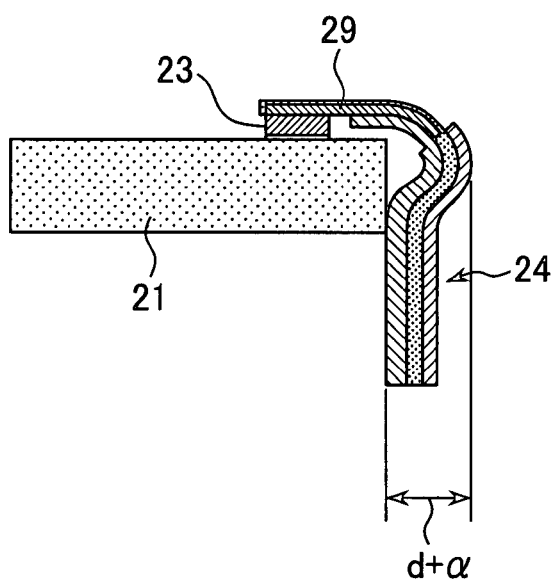

SOLID-STATE IMAGING APPARATUS

This application claims benefit of Japanese Patent Application No. 2006-204284 filed in Japan on Jul. 27, 2006, the contents of which are incorporated by this reference.

BACKGROUND OF THE INVENTION

The present invention relates to solid-state imaging apparatus in which a solid-state imaging device chip and an electric signal outputting member are connected to each other, and more particularly relates to a solid state imaging apparatus using a flexible board as the member for outputting electric signal.

In general, a reduction in size is sought in the packaging of solid-state imaging device. Especially in the medical field, for example, the reduction in size of imaging unit using solid-state imaging device depends largely on how such packaging form can be reduced in size. In connection with the downsizing, attempts have been made in the packaging form using a flexible board so as to narrow pitch in the wiring pattern within the flexible board. As a result, the form of packaging has become complicated.

Under the circumstances, disclosure has been made in Japanese Patent Application Laid-Open 2003-133654 of an example of solid-state imaging apparatus where solid-state imaging device for use for example in medicine is mounted on a flexible board. FIGS. 1A, 1B show a prior-art solid-state imaging apparatus as disclosed in the publication. This prior-art example is constructed such that, after connecting a bump 23 formed on an electrode 22 provided on solid-state imaging device 21 to an inner lead 29 of flexible board 24 as shown in FIG. 1A, the flexible board 24 is bent as shown in FIG. 1B along a side face 21a at an end portion of the solid-state imaging device 21. A thin portion 28 is formed on the flexible board 24 in a portion of its base film 25 corresponding to an extent from the angular portion to the side face of the solid-state imaging device 21. The thin portion 28 is formed to have a smaller thickness than the bump 23 formed on the electrode 22 over the solid-state imaging device 21. It is thereby presumably possible not to hinder connection of the flexible board 24 to the solid-state imaging device 21, and edge short can be prevented even when the inner lead 29 is bent. It should be noted that what is denoted by numeral 26 in FIGS. 1A, 1B is a wiring pattern within the flexible board 24.

With the above described prior-art technique for mounting solid-state imaging apparatus onto a flexible board, however, tenacity against bend occurs due to the fact that the inner lead 29 exists at the portion where the thin portion 28 of base film 25 of flexible board 24 is formed. Accordingly, when the flexible board 24 is bent along the side face 21a of the solid-state imaging device 21, its bendability may be hindered to result a greater radius of curvature of bend as shown in FIG. 2. For this reason, though it is effective in preventing an edge short, size of the bend portion becomes an addition of what corresponds to a curved portion α to the thickness "d" of the flexible board 21 so that there is a possibility of being unable to facilitate a reduction in size of the terminal end portion as of an imaging unit. Also, a special processing step is required to form the thin portion 28 on the base film 25 of the flexible board 24. Further, work is complicated for the construction where the inner lead 29 is bent, which causes a lowered yield. Furthermore, since the bend portion is always under pressure, reliability might be lowered.

SUMMARY OF THE INVENTION

The present invention has been made to eliminate the above problems in the prior-art solid-state imaging apparatus having a solid-state imaging device mounted on flexible board, and its object is to provide a solid-state imaging apparatus in which, at the same time of achieving a reduction in size of its terminal end portion, manufacturing method can be simplified to accomplish an increase in yield and reduction in cost, and so as to lead to an improved reliability.

To solve the above problems, there is provided a solid-state imaging apparatus in accordance with a first aspect of the invention, including: a solid-state imaging device chip having an electrode pad provided on its front face; and a flexible board having a connecting electrode formed on an end face and being adhered at an end portion thereof to a side face of the solid-state imaging device chip so that the connecting electrode is positioned substantially in the same plane as the electrode pad of the solid-state imaging device chip. The electrode pad of the solid-state imaging device chip and the connecting electrode of the flexible board are electrically connected to each other.

In a second aspect of the invention, the electrode pad and the connecting electrode in the solid-state imaging apparatus according to the first aspect are connected to each other through a wire bonding.

In a third aspect of the invention, the electrode pad and the connecting electrode in the solid-state imaging apparatus according to the first aspect are connected to each other through a flip chip bonding using a wiring board.

In a fourth aspect of the invention, the connecting electrode in the solid-state imaging apparatus according to the second or third aspect is formed of an end surface of wiring pattern having a thickness increased in the vicinity of an end portion of the flexible board.

In a fifth aspect of the invention, the connecting electrode in the solid-state imaging apparatus according to the second or third aspect is a post electrode formed on an end face of wiring pattern of the flexible board.

BRIEF DESCRIPTION OF THE DRAWINGS

FIGS. 1A and 1B are typical sectional views showing an example of construction of prior-art solid-state imaging apparatus.

FIG. 2 is a typical sectional view for explaining concept of the problems in the prior-art example.

DESCRIPTION OF THE PREFERRED EMBODIMENTS

An embodiment of the solid-state imaging apparatus according to the present invention will be described below with reference to the drawings.

Embodiment 1

Figure 3:
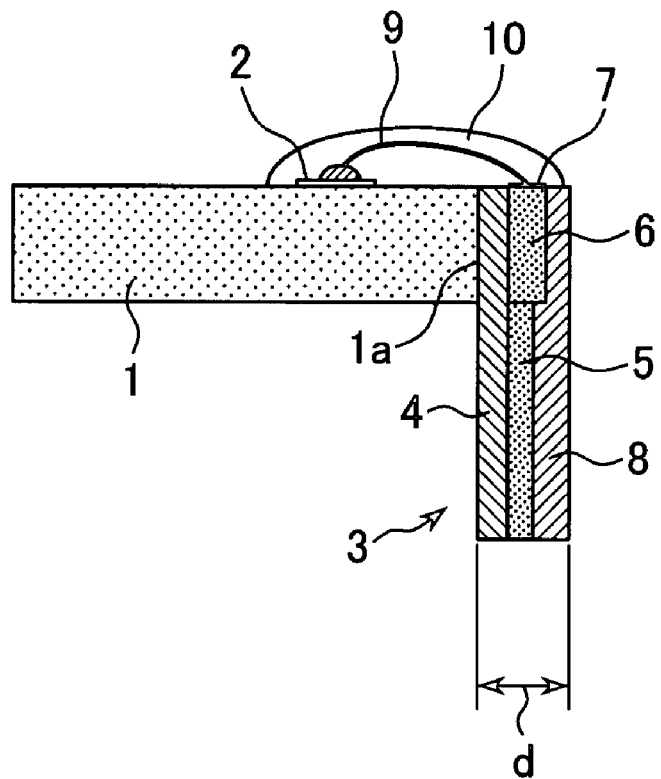
FIG. 3 is a typical sectional view showing construction of a first embodiment of the solid-state imaging apparatus according to the invention.

A first embodiment of the invention will be described below. FIG. 3 is a sectional view showing construction of the first embodiment of the solid-state imaging apparatus according to the invention. In the present embodiment, an exposed end face of internal wiring pattern is used as the connecting electrode of a flexible board. An electrode pad disposed on a front side of solid-state imaging device chip and the end face of the internal wiring pattern that is the connecting electrode of the flexible board are then electrically connected to each other through wire bonding.

In particular, as shown in FIG. 3, an end portion of flexible board 3 cut so as to have a sectional configuration exposing an internal wiring pattern 5 is adhered by means of an adhesive (not shown) to a side face 1a of solid-state imaging device chip 1 in position where the cut face thereof and the front face of the solid-state imaging device chip are substantially in the same plane. The internal wiring pattern 5 of the flexible board 3 is formed with a thick portion 6 by increasing its thickness in the vicinity of the cut portion, and the cut face thereof is used as an end face electrode for connection 7. The end face electrode 7 and an electrode pad 2 on the solid-state imaging device chip are electrically connected to each other through wire bonding using a wire 9 such as Au or Al. The wire bonding portion including the end face electrode 7 and the electrode pad 2 is sealed with a sealing resin 10 so as to also provide a mechanical protection.

Here, the solid-state imaging device chip 1 may be of any kind such as CCD or CMOS sensor. Further, an optical component such as filter, glass or lens may also be provided on the front face of the solid-state imaging apparatus in any region but the electrode pad portion.

The adhesive for adhering the solid-state imaging device chip 1 and the flexible board 3 to each other is preferably but not limited to resins for example of a thermosetting type or UV curing type. As the wire bonding method using wire 9, the technique of either ball bonding or wedge bonding may be used. The sealing resin 10 is generally but not limited to a thermosetting type epoxy or phenol resin.

A description will be given in detail below with respect to construction of the flexible board 3 according to the first embodiment. Of the flexible board 3, after forming the wiring pattern 5 by means of etching of a copper-clad laminate having copper thin film provided on a base film 4, the thick portion 6 is formed by applying partial plating only on an optional area. In this example, the thick portion 6 by partial plating is determined as a portion of the length of wiring pattern corresponding to the thickness of the solid-state imaging device chip 1. The partial plating is preferably Cu plating which is the same metal as the copper thin film. Subsequently, a cover layer 8 is applied, and the thick portion 6 of the internal wiring pattern 5 is exposed by cutting along a vertical direction. The exposed thick portion 6 of the internal wiring pattern 5 is subjected at its cross section to such processing as polishing and cleaning as required, and Ni plating of the order of 2 to 5 μm as under coat and a surface treatment by Au plating of the order of 0.3, μm as surface layer for example are applied on it to form the end face electrode 7 that is the connecting electrode. It should be noted that the detail of the material, thickness and surface treatment of the end face electrode 7 is not limited to the above. The end face electrode 7 and the electrode pad 2 provided on the solid-state imaging device chip 1 are then electrically connected to each other by means of wire bonding using wire 9.

The necessity of forming the thick portion 6 by partial plating will now be described. An electrode portion to be wire-bonded is required to have a size capable of being connected by wire bonding. On the flexible board where attempts have been made to narrow pitch, however, it is difficult to secure a sufficient size as a connecting electrode. For example, if the wiring pitch is 80 μm (40 μm width and interval each of the wiring) when a copper-clad laminate having a copper thin layer of 18 μm thickness for general use is used as the flexible board, the size of the end face electrode is 18 μm×40 μm. The area of such size is too narrow as a connecting electrode, and a reliable wire bonding becomes impossible. To secure a sufficient size as the connecting electrode, therefore, the thick portion is formed by increasing the thickness of wiring pattern by partial plating in the vicinity of the cut portion of the flexible board. For example, if a thick portion of 38 μm (=18 μm+20 μm) thickness is formed by means of a partial plating of 20 μm thickness, the area of the end face electrode becomes 40 μm×38 μm which is a sufficient size for wire bonding.

As the above, the flexible board is adhered to a side face of the solid-state imaging device, and the electrode pad on the solid-state imaging device chip and the end face electrode formed in the cut plane of the flexible board are wire-bonded with using a wire. The electric connection between the solid-state imaging device chip and the flexible board is thereby secured, and at the same time a bend portion as in the prior-art example need not be provided. Accordingly, the size of the mounting portion is only of the thickness d of the flexible board so that a reduction in size of the solid-state imaging apparatus is possible. Further, the manufacturing method becomes simpler to facilitate simplification of work so that an increased yield, reduced cost and improved reliability can be achieved.

Embodiment 2

Figure 4:
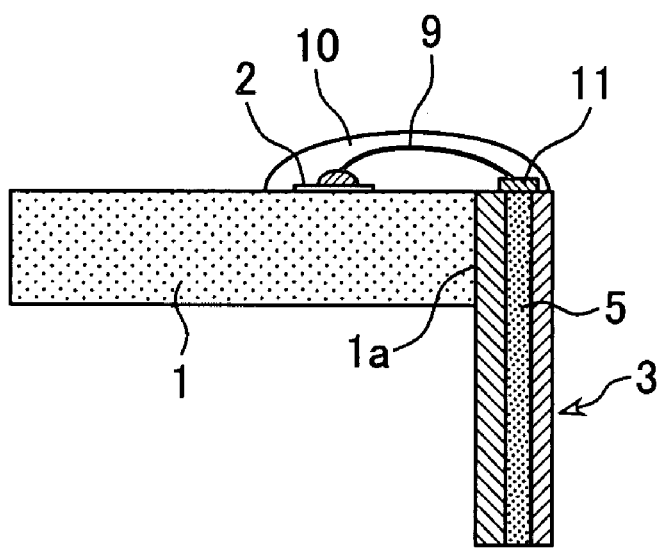
FIG. 4 is a typical sectional view showing construction of the solid-state imaging apparatus according to a second embodiment.

A second embodiment of the invention will now be described. FIG. 4 shows construction of the solid-state imaging apparatus according to the second embodiment. In the second embodiment, a post electrode formed anew on an exposed internal wiring pattern is used as the connecting electrode of a flexible board. An electric connection between an electrode pad provided on the front face of solid-state imaging device chip and the post electrode is then effected by means of wire bonding.

In particular, as shown in FIG. 4, an end portion of flexible board 3 cut so as to have a sectional configuration exposing an internal wiring pattern is adhered by means of an adhesive (not shown) to a side face 1a of solid-state imaging device chip 1 in position where the cut face thereof and a front face of the solid-state imaging device chip are substantially in the same plane. A newly added post electrode 11 is formed on the cut face of the internal wiring pattern 5 of the flexible board 3. The post electrode 11 is electrically connected to an electrode pad 2 on the solid-state imaging device chip through wire bonding using wire 9 such as Au or Al. The wire bonding portion including the post electrode 11 and the electrode pad is sealed with a sealing resin 10 so as to also provide a mechanical protection.

Here, the solid-state imaging device chip 1 may be of any kind such as CCD or CMOS sensor. Further, an optical component such as filter, glass or lens may also be provided on the front face of the solid-state imaging apparatus in any region but the electrode pad portion.

The adhesive for adhering the solid-state imaging device chip 1 and the flexible board 3 to each other is preferably but not limited to resins for example of a thermosetting type or UV curing type. As the wire bonding method using wire 9, the technique of either ball bonding or wedge bonding may be used. The sealing resin 10 is generally but not limited to a thermosetting type epoxy or phenol resin.

The flexible board 3 according to the second embodiment will be described below in detail. The internal wiring pattern 5 of the flexible board 3, unlike the first embodiment, does not have any thick portion by partial plating. Instead, the post electrode 11 having a size of the order of 40 square μm and a thickness of the order of 10 to 20 μm is formed by means of isotropic plating on the internal wiring pattern 5 exposed as a result of severing of the flexible board 3, after subjecting it to such processing as polishing and cleaning as required. Here, plating of Cu, which is the same metal as the copper thin film, is desirably used as the isotropic plating. Further, Ni plating of the order of 2 to 5 μm as under coat and a surface treatment by Au plating of the order of 0.3 μm as surface layer are applied on the post electrode 11 to finish the post electrode 11 at the end. It should be noted that the material, thickness and surface treatment of the post electrode 11 are not limited to the above.

The post electrode 11 and the electrode pad 2 on the solid-state imaging device chip 1 are then electrically connected to each other through wire bonding using the wire 9.

Based on the construction as the above, the solid-state imaging apparatus according to the second embodiment, in addition to the advantages obtained in the first embodiment, has an advantage that a further reduction in size is possible, since the flexible board can be formed with a further reduction in thickness corresponding to the fact that a thick portion of the wiring pattern is not formed. While the post electrode has been formed by means of isotropic plating in the present embodiment, the method thereof is not limited to isotropic plating as far as an electrode can be formed with securing a flatness of the order of 40 square μm.

Embodiment 3

Figure 5:
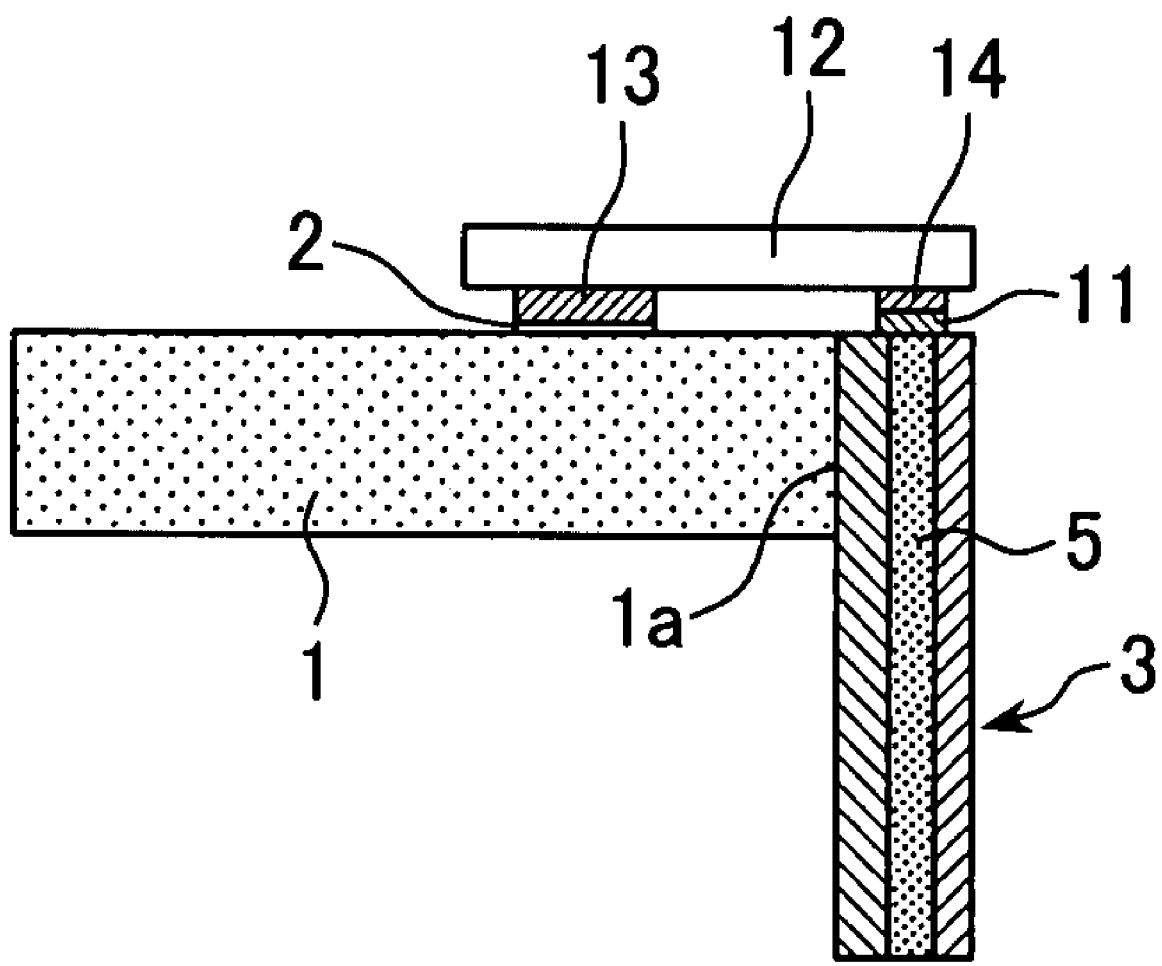
FIG. 5 is a typical sectional view showing construction of the solid-state imaging apparatus according to a third embodiment.

A third embodiment of the invention will now be described. FIG. 5 shows construction of the solid-state imaging apparatus according to the third embodiment. In this embodiment, a post electrode formed anew on an exposed internal wiring pattern is used as the connecting electrode of a flexible board, and an electrode pad provided on a front side of solid-state imaging device chip and the post electrode are electrically connected to each other through flip chip bonding by means of a wiring board.

In particular, as shown in FIG. 5, an end portion of flexible board 3 cut so as to have a sectional configuration exposing an internal wiring pattern is adhered by means of an adhesive (not shown) to a side face 1a of solid-state imaging device chip 1 in position where the cut face thereof and a front face of the solid-state imaging device chip are substantially in the same plane. A newly added post electrode 11 is formed on the cut face of an internal wiring pattern 5 of the flexible board 3. The post electrode 11 and an electrode pad 2 on the solid-state imaging device chip are then electrically connected to each other by means of flip chip bonding respectively through bumps 14, 13 and a wiring board 12. The method for providing the post electrode 11 is similar to the second embodiment.

Here, the solid-state imaging device chip 1 may be of any kind such as CCD or CMOS sensor. Further, an optical component such as filter, glass or lens may also be provided on the front face of the solid-state imaging apparatus in any region but the electrode pad portion.

The adhesive for adhering the solid-state imaging device chip 1 and the flexible board 3 to each other is preferably but not limited to resins for example of a thermosetting type or UV curing type.

The flip chip connection using the wiring board 12 according to the third embodiment will now be described in detail. The wiring board 12 is formed of an organic or inorganic substrate, and is provided with connecting pads (not shown) at locations respectively corresponding to the bump 13 that is provided on the electrode pad 2 of the solid-state imaging device chip 1 and bump 14 that is provided on the post electrode 11 of the flexible board 3. The wiring board 12 is constructed as a relay board where the connecting pads are electrically connected to each other through a metal wiring (not shown). The wiring board 12 is then connected through flip chip bonding to the solid-state imaging device chip 1 and to the flexible board 3 by means of ultrasonic wave, thermocompression bonding or a combined process of these.

Here, the bumps provided on the solid-state imaging device chip 1 and on the flexible board 3 may be formed on the connecting pads of the wiring board 12 instead. The forming of bump in such case may be of any type including stud bump, plating bump, etc. Further, anisotropic conductive paste (ACP) or anisotropic conductive film (ACF) which is an anisotropic conductive adhesive, or non-conductive paste (NCP) may be used in the flip chip bonding of the wiring board 12. Furthermore, while one formed with the post electrode 11 has been used as the flexible board 3, it is naturally also possible to use a flexible board where an end face electrode is formed on the internal wiring pattern in a similar manner as the first embodiment.

Based on the construction as the above, the solid-state imaging apparatus according to the third embodiment has an advantage that a large number of electrical connection can be effected at once in addition to the advantages of the first and second embodiments. There is also a merit that, unlike the wire bonding connection using wire, load on subsequent handling is reduced.

While, in the above embodiments, one using a copper-clad laminate on one side has been shown as the flexible board, a similar advantage may naturally be obtained also when a two-side copper-clad laminate is used. Further, if the wiring pattern pitch is broader, it suffices to use a thicker copper film in the first place. In such a case, since a size required in bonding as a connecting electrode is already secured by the wiring pattern exposed on the cut face of the flexible board, there is no need to provide a thick portion in wiring pattern or a post electrode as one in the present invention.

As has been described by way of the above embodiments, it is possible according to the first aspect of the invention to accomplish a solid-state imaging apparatus for use for example within an imaging unit of endoscope, which can be reduced in size with an improved reliability. Also, since simplification of manufacturing method is achieved, an increase in yield and reduction in cost are expected. According to the second aspect, a secure and reliable electrical connection is readily possible with keeping reduction in size. According to the third aspect, a secure and reliable electrical connection can be readily effected at once with keeping reduction in size. According to the fourth and fifth aspects, in spite of the board having narrow pitch, a secure and reliable electrical connection can be readily effected in a small size.

What is claimed is:

1. A solid-state imaging apparatus comprising:
a solid-state imaging device chip having an electrode pad provided on its front face; and
a flexible board having an internal wiring with an end face alone thereof being exposed to form a connecting electrode;
wherein said flexible board is adhered without having a bent portion to a side face of said solid-state imaging device chip so that the electrode pad on said solid-state imaging device chip and the connecting electrode of said flexible board end face are positioned substantially in the same plane in their horizontal direction; and
wherein the electrode pad of said solid-state imaging device chip and the connecting electrode of said flexible board are electrically connected to each other.

2. The solid-state imaging apparatus according to claim 1, wherein said electrode pad and said connecting electrode are connected to each other through a wire bonding.

3. The solid-state imaging apparatus according to claim 1, wherein said electrode pad and said connecting electrode are connected to each other through a flip chip bonding using a wiring board.

4. The solid-state imaging apparatus according to claim 2, wherein said connecting electrode comprises an end surface of wiring pattern having a thickness increased in the vicinity of the end portion of the flexible board.

5. The solid-state imaging apparatus according to claim 3, wherein said connecting electrode comprises an end surface of wiring pattern having a thickness increased in the vicinity of the end portion of the flexible board.

6. The solid-state imaging apparatus according to claim 2, wherein said connecting electrode comprises a post electrode formed on an end face of wiring pattern of the flexible board.

7. The solid-state imaging apparatus according to claim 3, wherein said connecting electrode comprises a post electrode formed on an end face of wiring pattern of the flexible board.

* * * * *